INVENTOR
JAKOB LUSCHER
BY

ATTORNEY

Nov. 5, 1963 J. LUSCHER 3,109,942
INTEGRATED STRUCTURE ELECTRONIC SEMI-CONDUCTOR DEVICE
COMPRISING AT LEAST ONE BISTABLE ELECTRIC CIRCUIT
Filed May 20, 1960 4 Sheets-Sheet 2

INVENTOR
JAKOB LUSCHER
BY John B. Hammentrout
ATTORNEY

INTEGRATED STRUCTURE ELECTRONIC SEMI-CONDUCTOR DEVICE COMPRISING AT LEAST ONE BISTABLE ELECTRIC CIRCUIT

Filed May 20, 1960 4 Sheets-Sheet 3

INVENTOR
JAKOB LUSCHER
BY John B. Hammerstadt
ATTORNEY

INVENTOR
JAKOB LUSCHER
BY John B. [signature]

ATTORNEY 3,109,942

INTEGRATED STRUCTURE ELECTRONIC SEMICONDUCTOR DEVICE COMPRISING AT LEAST ONE BISTABLE ELECTRIC CIRCUIT

Jakob Luscher, Geneva, Switzerland, assignor to Societe Suisse pour l'Industrie Horlogere S.A., Geneva, Switzerland, a firm of Switzerland Filed May 20, 1960, Ser. No. 30,582
Claims priority, application Switzerland May 27, 1959
9 Claims. (Cl. 307—88.5)

The present invention relates to an electronic semi-conductor device comprising at least one bistable electric circuit.

The use of a number of bistable electric circuits of constantly increasing size in the construction of various electronic devices, such for example as computing machines, counters or scalers, requires that such circuits should be of very small overall dimensions and therefore of simple design. This is why use is made of circuits comprising semi-conductors. However, circuits of this type as at present known are fairly complex and when they are used in large numbers they form devices of relatively large overall dimensions, the energy consumption of which is frequently inadmissibly high. This is because such circuits generally comprise at least two transistors connected by a variable number of resistances, capacitors, diodes and the like, and the overall dimensions and complexity of a device comprising a large number of such circuits can readily be appreciated.

The invention has for its object to supply an electronic semi-conductor device comprising bistable circuits which has no external coupling elements, such as resistances, capacitors, diodes and the like, the semi-conductor itself performing all the necessary functions. It is distinguished from the known devices by the fact that it comprises a monocrystalline semi-conductor support having for each circuit at least one monocrystalline semi-conducting layer of opposite type of conduction to that of the support, which layer in turn comprises two semi-conducting zones of the same type as the support which are so disposed that they each form with the said layer a fieldistor, the two fieldistors thus formed each being connected in series between the support and a resistance insulated from the latter in such manner as to form a current path of controllable resistance, while each of the two identical parts of the circuit, formed by a resistance, a fieldistor and the support, is connected to a direct-voltage source in such manner that the barrier between the support and the said monocrystalline layer forms an electric insulation, the zone of the fieldistor of one part being connected to the point of connection between the resistance and the fieldistor of the other part, which point of connection is in turn connected to an alternating-voltage source through a capacitor, the whole arrangement being such that an appropriate voltage pulse sent by the said alternating-voltage source produces the extension of the barriers in the fieldistor in the conductive state and the contraction of the barriers in the fieldistor in the blocked state, and consequently the change-over of the circuit formed of the said two parts from one of its stable states to the other.

A number of constructional forms of the device according to the invention are diagrammatically illustrated by way of example in the accompanying drawings.

It is to be noted that all the figures of the drawings are drawn to an extremely enlarged scale, the device according to the invention having in fact extremely small overall dimensions. Thus, a device comprising about twenty bistable circuits has in fact a surface of only about 1 square millimeter and a thickness of a few tenths of a millimeter.

Figure 1:
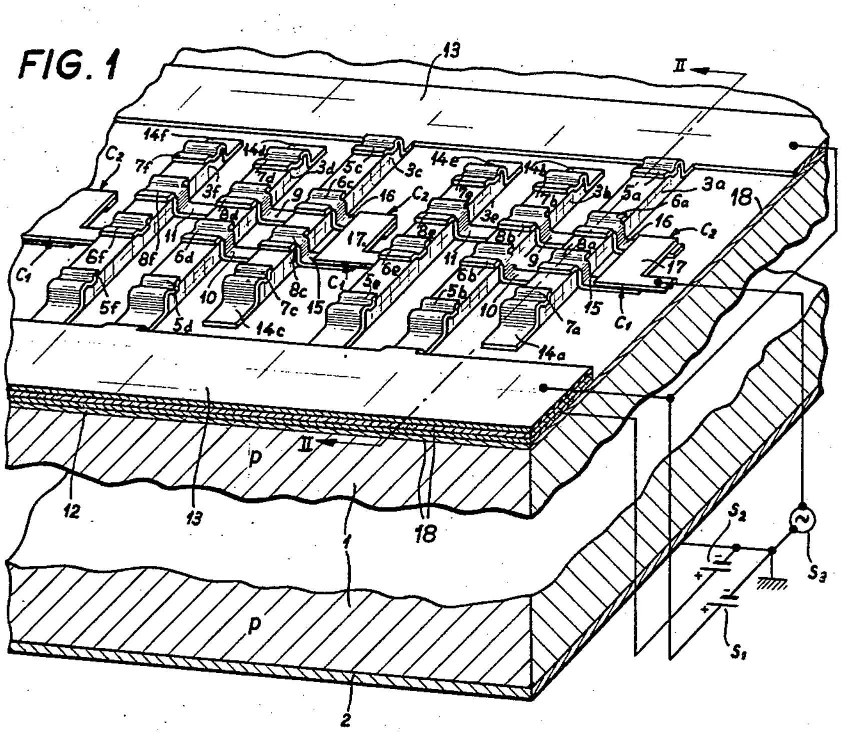
FIGURE 1 is a view in perspective showing a part of the device comprising two bistable circuits.

The device illustrated in FIGURE 1 consists of a semi-conductor monocrystal 1, for example silicon of p-type conduction, which is provided on one of its faces with an ohmic contact 2 intended to connect it to the negative pole of a direct-voltage source $S_1$. The monocrystal 1 is shown in FIGURE 1 without a part of its thickness, this part having been removed to show more clearly the proportion between various parts of the device. The crystal 1 has in relief on its other face six monocrystalline layers *3a–3f* having n-type conduction, which are obtained, for example, by the diffusion process. Each of the layers *3a–3f* comprises a zone 4 having p-type conduction (FIGURE 2) which is also obtained by diffusion. The layers *3a–3f* are each provided in addition, with three ohmic contacts 5 to 7, a fourth contact 8 being provided on the zone 4, all these contacts consisting, for example of nickel. As will be seen from FIGURE 1, the arrangement of the contacts 5 to 7 is the same in the case of the layers *3a* and *3c* while in the case of the layers *3b*, *3e*, *3d* and *3f* it is reversed. This has been done in order to avoid crossing of the conductors connecting certain contacts together.

The contacts 6 and 8 of the layers *3a* and *3b* are connected together through conductors 9 and 10, as also are the contacts 6 and 8 of the layers *3c* and *3d*. The contacts 5 and 7 of the layers *3a*, *3b*, *3c* and *3d* are connected respectively to a conductor 13 intended to be connected to the positive pole of the said direct-voltage source and to the crystal 1 through a contact 14, the contacts of the layers *3e* and *3f* being connected to a conductor 12 intended to be connected to the positive pole of a direct-voltage source $S_2$ and to the contact 14 respectively.

Figure 2:
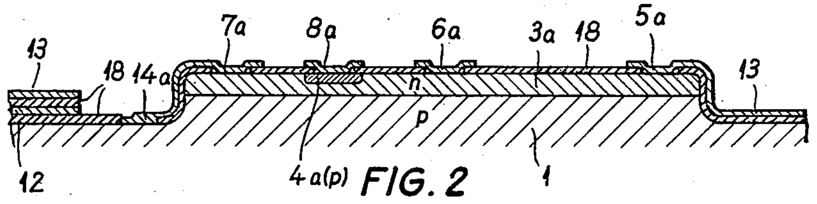
FIGURE 2 is a section along the line II—II of FIGURE 1.

The contacts 6 and 8 of the layer *3c* are connected to the contact 6 of the layer *3e* through two condensers $C_1$ and $C_2$ formed of two conductors 15 and 16, on the one hand, and a conductor 17 on the other hand, which is separated therefrom by insulation. The same capacitors are provided to connect the contacts 6 and 8 of the layer *3a* to an alternating-voltage source $S_3$, and the contact 6 of the layer *3f* to a succeeding layer, the contact 8 of the latter and that of the layer *3e* being connected, respectively, to the contact 8 of the layer *3d* and of the layer *3b* through a conductor 11. Since all the conductors consist, for example, of nickel, they are insulated from the crystal 1 and from the layers *3a* to *3f* by an insulating layer 18, for example of silicon oxide (FIGURE 2).

Before the operation of the device described and illustrated is explained, it is necessary to give a number of explanations of the physical principles employed to enable it to be more readily understood.

Figure 3:
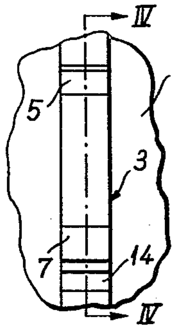
FIGURES 3 to 9 show various parts of the device and the curves explaining their operation.
Figure 4:
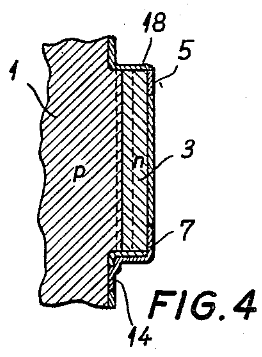
Figures 5, 6, 7, 8, 9:
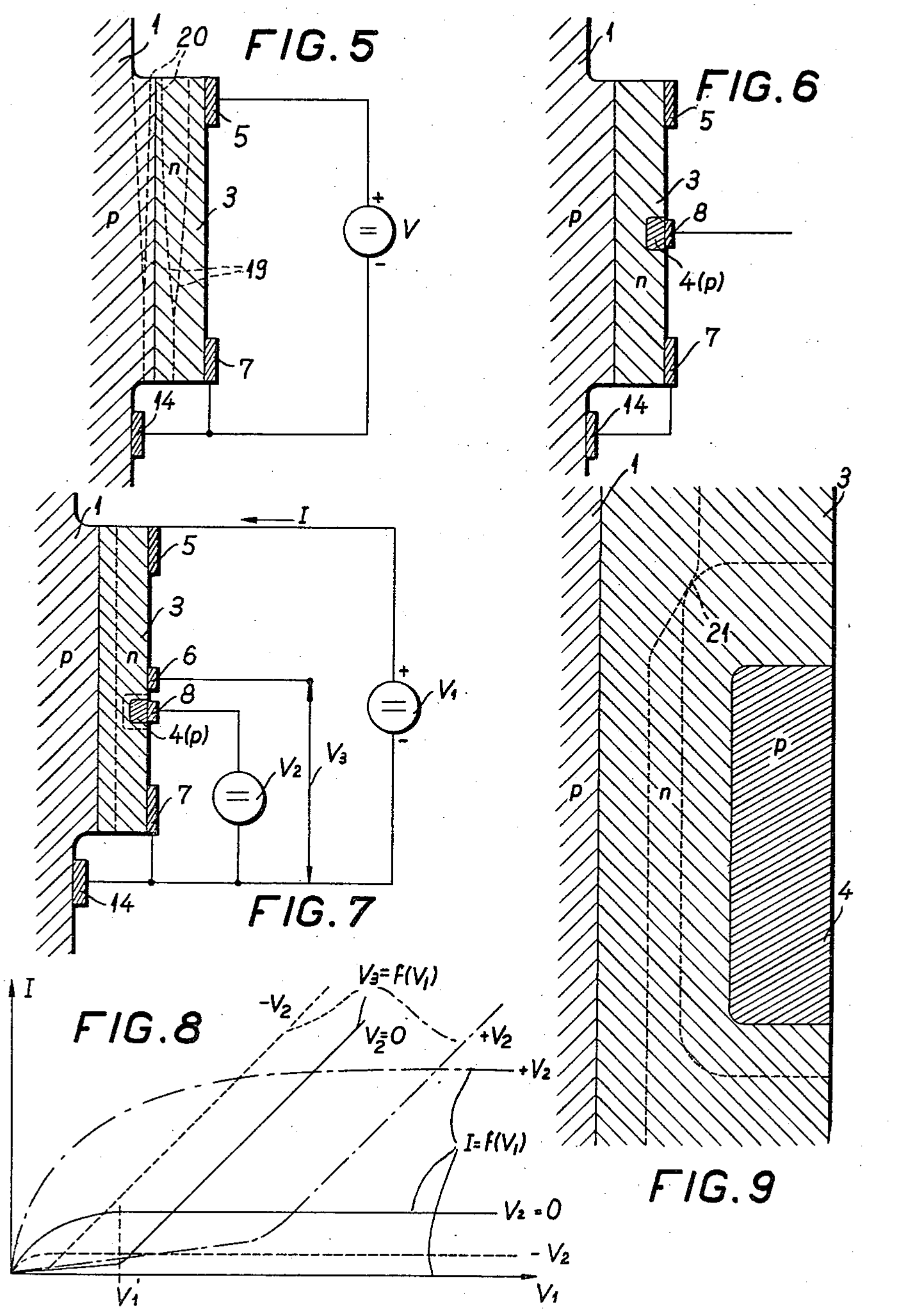

FIGURES 3 and 4 show in plan view and in section a monocrystal 1, for example of p-type, silicon, on which there has been deposited in relief by known methods a semi-conducting layer 3 of n-type. The layer 3 is provided with two ohmic contacts 5 and 7, the latter of the two being connected to a contact 14 provided on the crystal 1. A layer 18, for example of silicon oxide, covers the entire crystal surface with the exception of the contacts. In the state of thermal equilibrium, the layer 3 has a positive potential in relation to the crystal 1. This potential difference depends upon the degree of doping of the layer 3 and of the crystal 1, and it generally reaches several tens of volts and produces a space charge zone or a barrier between the free charges contained in the crystal 1 and the layer 3. This barrier, which contains substantially no free charges, forms an electric insulation extending as indicated in chain lines in FIGURE 4. Its thickness is generally several times $10\mu$. FIGURE 5 shows how the thickness of this barrier varies when a direct voltage is applied between the contacts 5 and 7. Thus, if the voltage applied to the contact 5 is positive in relation to the contact 7, the barrier extends as indicated in chain lines 19. The resistance between the contacts 5 and 7 then depends upon the geometry of that portion of the layer 3 which remains conductive, upon the concentration of the free charges in this part and upon their mobility.

If, on the other hand, a negative voltage is applied to the contact 5 in relation to the contact 7, the barrier contracts as indicated in chain lines 20. The potential difference between the crystal 1 and the layer 3, that is to say, between the p-region and the n-region, is reduced. When this potential reduction is sufficiently great, the thermal energy of the free charges may be sufficient to overcome this potential barrier, so that a current is set up in the p-region in parallel with that passing through the n-region between the contacts 5 and 7. However, when the voltage applied is relatively low, of the order of about 0.3 to 0.5 volt, this current is substantially negligible in the case of a semi-conductor having a relatively high activation energy, such for example as silicon. In such cases, the barrier therefor constitutes a perfect electric insulation between the crystal 1 and the layer 3.

FIGURE 6 illustrates the same device as that shown in FIGURE 5, but with, in addition, a p-type zone diffused into the layer 3 provided with an ohmic contact 8. As is known, such a device permits of controlling the resistance between the contacts 5 and 7 by means of a voltage applied between the contacts 7 and 8 and is known as a fieldistor.

FIGURE 7 illustrates a device similar to that of FIGURE 6, comprising in addition an ohmic contact 6 between the contacts 5 and 8. It will readily be seen that this device is formed of a resistance, notably between the contacts 5 and 6, in series with a fieldistor, supported by the crystal 1, of which the controllable-resistance current path consisting of the resistance and the fieldistor in series is electrically insulated by the barrier. The curve of FIGURE 8 shows the dependence of the current I upon the voltage $V_1$ applied between the contacts 5 and 7, for three different values of the voltage $V_2$ applied between the contacts 7 and 8. The same curve illustrates the dependence of the voltage $V_3$ between the contacts 6 and 7, upon the voltage $V_1$. $V'_1$ represents the voltage at which the barriers would join if the contact 7 were floating (disconnected). For voltages higher than $V'_1$, the barriers remain locally very close together, but they do not become joined. FIGURE 9 shows in principle the form of the barriers in such cases, with $V_2=0$. Any voltage drop takes place substantially in the narrow passage 21 formed between the two barriers (FIGURE 9). It can therefore be said that the device is in a state of current saturation.

Figure 10:
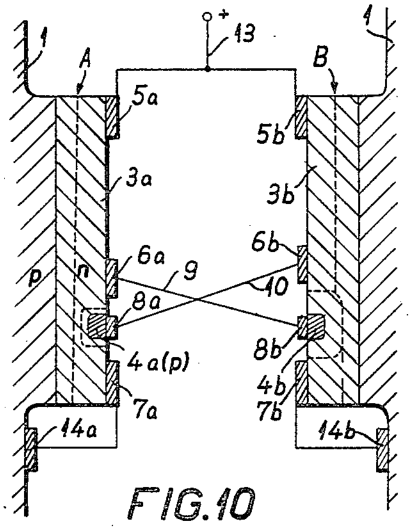
FIGURE 10 illustrates a bistable circuit according to the invention.

FIGURE 10 shows a bistable circuit formed of two identical parts, each corresponding to the device illustrated in FIGURE 7. As will be seen, the contacts *5a* and *5b* of each of the two parts A and B respectively are connected to a conductor 13 which may itself be connected to the positive pole of a direct-voltage source, the negative pole of which is connected to the crystal 1. The contact *6a* of the part A is connected to the contact *8b* of the part B, the contact *6b* of the later being connected to the contact *8a* of the part A. It is to be noted that the barriers in the p-regions, i.e. in the crystal 1 and in the zones 4, have been omitted from the drawings for the sake of simplicity. Moreover, they are of no importance to the operation of the circuit. On the other hand, it will be understood that the parts A and B are mounted on the same crystal, as illustrated in FIGURE 1, and that the illustration used in FIGURE 10 is only a diagrammatic illustration to show more clearly the circuit as a whole, the operation of which is as follows:

It will be assumed that the part B is in the saturated state, the barriers thus being substantially united. Consequently, the contact *6b* is at a positive potential in relation to the conact *6a*, this positive potential consequently being applied also to the contact *8a* of the zone *4a*, so that the barrier of the zone *4a* is withdrawn and the part A is not in the saturated state. However, this circuit would be unstable if a small variation of the voltage between the contacts *8b* and *7b* produced a larger variation of the voltage between the contacts *6a* and *7a*, assuming that the contact *6a* was disconnected from the contact *8b*. This depends upon the dimensions of the layers 3 and of the zones 4, as also upon their degree of doping. Now, if instability is not desired, it is possible to dimension the device in such manner that the barriers are joined in the layer 3 even in the state of thermal equilibrium. The saturation current is in this case substantially zero. A small variation of the voltage between the contacts *8b* and *7b* no longer produces any variation of the voltage between the contacts *6a* and *7a*, so that such a state is stable.

Figures 11, 15:
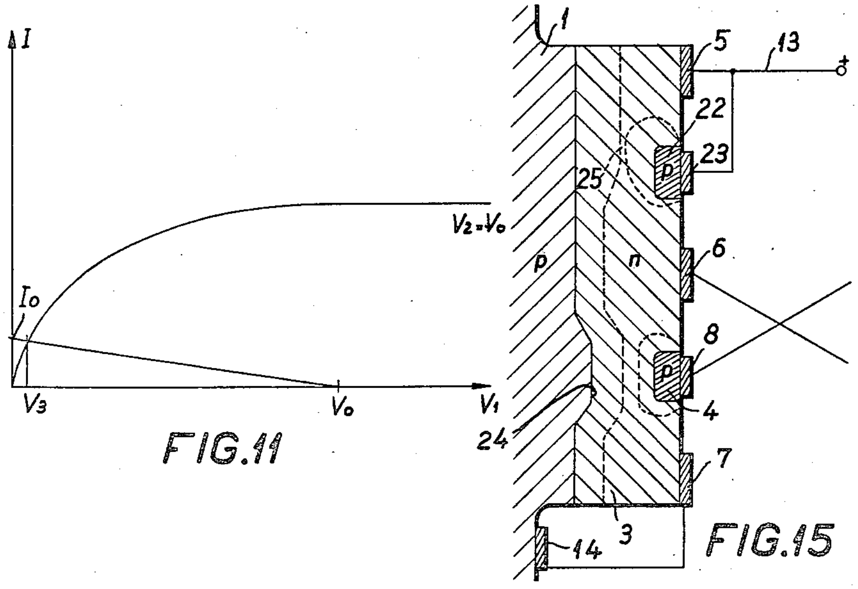
FIGURE 11 is a characteristic curve of the circuit illustrated in FIGURE 10.
FIGURE 15 shows a part of the bistable circuit according to another embodiment.

FIGURE 11 shows the current I as a function of the voltage $V_3$ (see FIGURE 7) for a voltage $V_2=V_0$ applied between the contacts *8a* and *7a*.

$$\frac{V_0}{I_0}$$

represents the value of the resistance between the contacts *5a* and *6a*. The intersection of the line extending from $V_0$ to $I_0$ with the saturation curve gives the value of the voltage $V_3$ between the contacts *6a* and *7a* for the state of conduction of the part A. For a value slightly higher than this, the part B must be blocked. As will be seen from the foregoing, the bistable circuit illustrated in FIGURE 10 can be controlled in a very simple manner.

Figure 12:
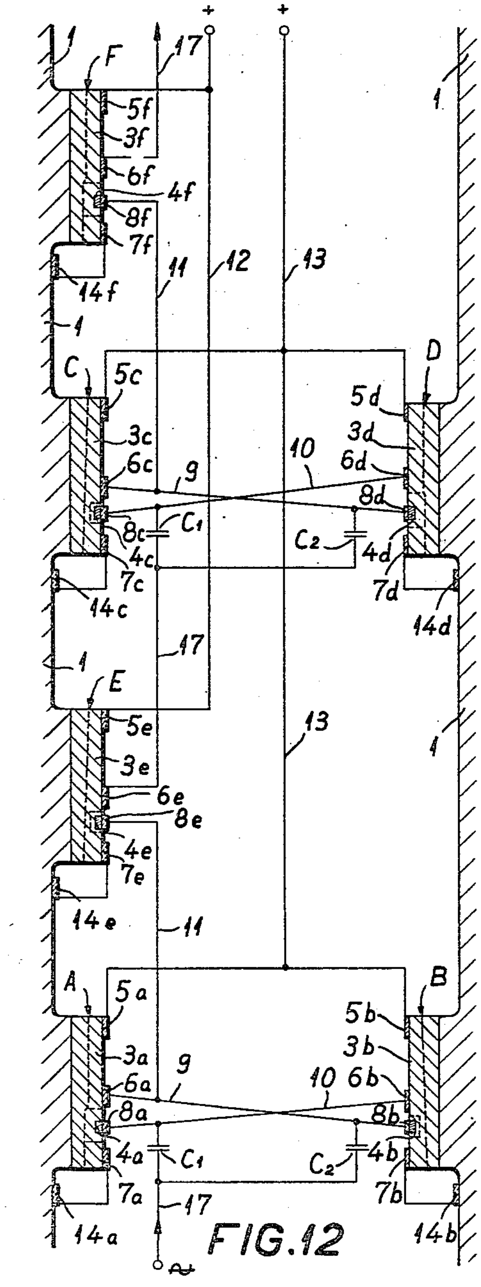
FIGURE 12 is the diagram of the device illustrated in FIGURE 1.

FIGURE 12 illustrates diagrammatically two bistable circuits connected together in such manner as to form the device illustrated in FIGURE 1. The operation of the latter will therefore be explained with the aid of this diagram. The circuit comprising two parts A and B is connected on the one hand to an alternating-voltage source (not shown) through two capacitors $C_1$ and $C_2$, and on the other hand to the input of the circuit comprising two patrs C and D through a decoupling device E and capacitors $C_1$ and $C_2$. As will be seen, this decoupling device is formed in the present instance in the same manner as each of the two parts forming a bistable circuit A—B and C—D, as has been explained with reference to the device illustrated in FIGURE 1. The circuit consisting of the parts A and B must therefore control the circuit consisting of the parts C and D, through the decoupling device E. The circuit C—D is followed by a second decoupling device F, through which it could control the following circuit.

Assuming that the parts A and D are in the saturated state, and are therefore non-conductive, the parts B and C being in the conductive state, as shown by the position of the barriers, the decoupling device E between the two circuits A—B and C—D is consequently in the conductive state.

At the change-over of the part A into the conductive state, the decoupling device E becomes nonconductive. The capacitors $C_1$ and $C_2$, which have a high value as compared with the capacitors formed by the junctions, will consequently be charged by the resistances existing between the contacts 5e and 6e of the decoupling device E, 6d and 5d of the part D and 6c and 7c of the part C. The voltages consequently produced between the contacts 8c and 6c, and 8d and 6d respectively, tend to maintain this bistable circuit C—D in the state in which it is at this instant. Since the resistance between the contacts 6c and 7c has a low value, the voltage positive in relation to the support 1 produced at the contact 6c and consequently at the contact 8f of the succeeding decoupling device F is very small and therefore cannot control this device.

At the change-over of the part A from the conductive state to the non-conductive state, the decoupling device E is brought into the conductive state. The capacitor $C_2$ is consequently discharged through the low resistances situation between the contacts 6c and 7c of the part C and between the contacts 6e and 7e of the decoupling device E. At the first instant, no voltage is set up between the contacts 6c and 8c of the part C and between the contacts 6d and 8d of the part D, so that the capacitor $C_2$ is very rapidly discharged. The negative voltage in relation to the support 1 produced at the contacts 8c and 6d causes the part C to change over, after this rapid discharge of the condenser $C_2$, into the non-conductive state and the part D into the conductive state. In order to ensure this change over, it is necessary that the feed voltage of the decoupling devices E and F should be higher than that of the bistable circuits A—B and C—D in order that the control voltage pulses may be sufficiently large. In addition, it may be advantageous to provide a resistance in the branch between the contact 8c and the condenser $C_1$, and between the contact 8d and the condenser $C_2$ respectively in order to prevent any charge injection in the support 1 at the instant of the negative voltage peak applied to the contact 8c or 8d from limiting this voltage which is required at the contacts 6d and 6c respectively in order to cause the barriers of the fieldistor to be sufficiently retracted for changing over the latter into the conductive state..

As will be seen from the foregoing, the bistable circuit C—D controlled by the bistable circuit A—B can be changed over only when the deblocking device E is in the conductive state. The same would be the case with a succeeding bistable circuit controlled by the circuit C—D through the deblocking device F. Such a deblocking device, in addition to performing its amplifying function, serves to decouple the capacitors $C_1$ and $C_2$ of the circuit A—B situated at the input of the circuit C—D. It is also advantageous to have a decoupling device at the input and at the output of an electronic device comprising a number of bistable circuits, such for example as a counter or a scaler. This is done in order to prevent the bistable circuits which have extremely low capacitances from being charged by external capacitances which are normally much higher.

It will therefore be seen that each of the bistable circuits contained in the electronic semi-conductor device according to the invention consists of two identical parts, each comprising a resistance in series with a fieldistor and being supported by a semi-conducting monocrystal. Each of these parts therefore forms a controllable resistance, the two parts being connected together in such manner that an increase in the resitsance of one part automatically produces a reduction in the resistance of the other part. As will be seen from FIGURE 1, all the members comprised in a device formed of one or more bistable circuits are to some extent "printed" on the monocrystal 1. Such a device may be produced, for example, in the following manner:

An n-type semi-conducting layer is diffused into a p-type monocrystal. The desired number of p-type zones are diffused into the n-type layer, using the photolithographic method. This method is based on the fact that certain substances can be rendered insoluble after having been exposed to ultraviolet light. Thus, for obtaining p-zones at the desired points of the n-layer, the surface of the latter is first oxidised, and the oxidised layer is exposed to light, after having been coated with a photosensitive substance, through a photonegative masking the points where it is desired to obtain p-zones. In this way, the oxidised layer can be dissolved at these points and will thus permit diffusion. The same photolithographic method is used to separate the different parts of the n-layer before forming the various circuits. This can be effected by etching to a depth of several $\mu$ in order to bring these various parts of the n-layer into relief on the monocrystalline support. After this etching, the entire surface is again covered with an insulating film, for example silicon oxide deposited by condensation, which is thereafter removed at the points where it is desired to obtain ohmic contacts, whereafter a layer, for example of nickel, is deposited and thereafter removed, again by the photolithographic method, at the points where it is not required. The capacitive couplings at the input of each circuit are obtained in the same way.

In the example of the device illustrated and described, the resistance in series with the fieldistor which is to be provided in each of the two parts of a circuit is formed of the same semi-conducting layer as the fieldistor. It will be obvious that this resistance could be separated from the fieldistor and formed by any other appropriate layer. Thus, for example, the current path comprised in each of the two parts of a bistable circuit could consist of two series-connected elements which are shown in FIGURES 5 and 6 respectively.

Figure 13:
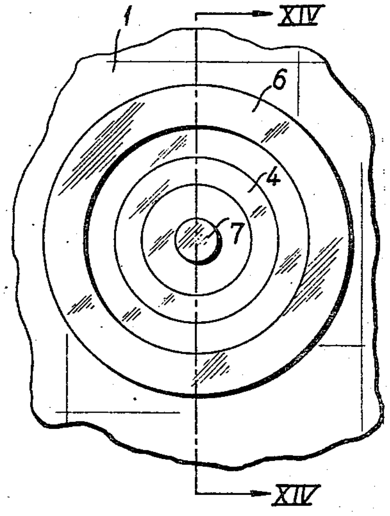
FIGURE 13 illustrates another constructional form of a fieldistor.
Figure 14:
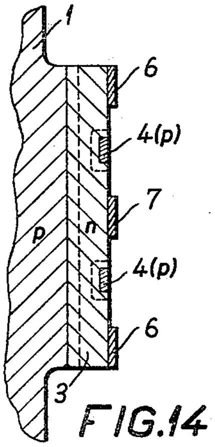
FIGURE 14 is a section along the line XIV—XIV of FIGURE 13.

FIGURES 13 and 14 illustrate in plan view and in section another constructional form of a fieldistor by means of which it is possible to reduce to a minimum the resistance of the latter when it is in the conductive state. As will be seen, the contact 6 intended to connect it to the charge resistance is in the form of a ring disposed concentrically around the p-zone, which itself forms a ring surrounding the contact 7 intended to connect the fieldistor to the monocrystalline support 1. Since the charge resistance must have a high value, it could be provided, for example, in the form of a current limiter. FIGURE 15 illustrates a modified form of the whole arrangement comprising the fieldistor and the charge resistance, wherein the latter consists of a current limiter. As will be seen, the layer 3 comprises between the contacts 5 and 6 a second zone 22 of p-type, which is provided with an ohmic contact 23 connecting it to the same direct-voltage source to which the contact 5 is connected. Since the zones 4 and 22 are of like dimensions and the latter is connected to the feed source, it has been necessary to make the zone 3 thinner at the position of the zone 4 in order that the barriers may unit when the current path formed by this part is to be rendered non-conductive. This difference in thickness of the layer 3 may be obtained by a two-phase diffusion: diffusion is first effected for a short period, care being taken that the portion 24 of the crystal 1 opposite which the zone 4 will subsequently be diffused into the layer 3 is protected from the diffusion whereafter the diffusion is also effected on the latter part of the crystal. It will readily be seen that the charge resistance will be formed substantially of the passage 25 between the barriers of the zone 22 and of the layer 3. It is to be noted that the passage 25 is situated at the point where the doping of the layer 3 is less intense and the resistance therefore higher. It will also be seen that the length of the charge resistance may be relatively short, which makes it possible to have a short electron transition period in these zones. The zone 22 need not be connected to a voltage source, the barrier due to the state of thermal equilibrium then being used alone.

It is to be noted that it would be advantageous also to control the charge resistance. For example, the diagram of FIGURE 12 will be considered at the instant when the part C is to be rendered non-conductive and the part D conductive, that is to say, at the instant when the barrier of the zone 4c has been extended. The condenser $C_1$ commences to be positively charged through the charge resistance (between the contacts 5d and 6d) on the part D and the condenser $C_2$ through the charge resistance (between the contacts 5c and 6c) of the part C. If the condensers are charged to a sufficiently high voltage, the barriers are narrowed and the corresponding parts are rendered conductive. It is essential that the part D should be rendered conductive before the part C, which is to be rendered non-conductive, is rendered conductive again by this effect. This is normally effected by making the voltage of the control pulses sufficiently high, but may also be effected by making the charge resistance of the part to be rendered non-conductive lower than that of the part to be rendered conductive, so that one of the capacitors C is charged more quickly than the other. Now, this could be effected by means of charge resistances provided with a semi-conducting zone of the opposite type as illustrated in FIGURE 15 and hereinbefore described. Instead of the contact 23 of the zone 22 being connected to the direct-voltage source (feed source of the circuit), it would be connected through a low-pass filter between the charge resistance and the fieldistor of the identical other part of the circuit. Thus, for example, the contact 23c of the zone 22c which would be included in the layer 3c of the part C would be connected to the contact 6d of the part D, and the contact 23d which would be included in the latter would be connected to the contact 6c of the part C. In this way, the charge resistance between the contacts 5c and 6c, i.e. the part C, would be controlled by the potential of the contact 6d, and the charge resistance between the contacts 5d and 6d, i.e. of the part D, by the potential of the contact 6c. The low-pass filters serve to retard the control effect on the resistances.

Figure 16:
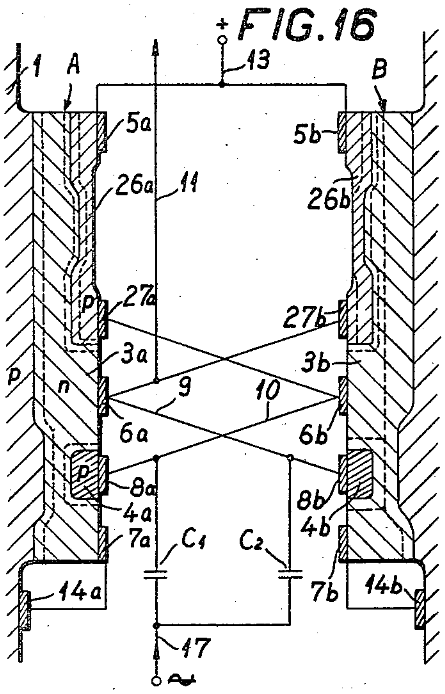
FIGURE 16 illustrates another construction form of the bistable circuit.

FIGURE 16 shows another constructional form of a bistable circuit according to the invention. As will be seen, the layer 3 of each of the two parts of the circuit comprises a second zone 26a, 26b extending from the contact 5a, 5b as far as a contact 27a, 27b situated in front of the contact 6a, 6b. The contact 27a is connected to the contact 6b and the contact 27b is connected to the contact 6a. It will readily be seen that the zones 26a and 26b are intended to serve as a charge resistance, the zone of one part being in series with the fieldistor of the other part. It is thus only a question of another constructional form of the charge resistances, by virtue of which the latter can also be controlled. By virtue of appropriate dimensioning, the charge resistance in series with the fieldistor in the conductive state (the resistance 26b in FIGURE 16) may have a substantially infinite value, the charge resistance in series with the blocked fieldistor (the resistance 26a in FIGURE 16) having a relatively low value. The result of this is that there is substantially no current in the two stable states of the circuit, the current being necessary only for effecting the change over of the circuit from one stable state to the other.

In the constructional forms of the device as described and illustrated, the layers 3a and 3b, 3c and 3d, etc. intended to form two parts of a bistable circuit are separate from one another. It will be obvious that, in a modification, a single layer of appropriate form could be provided for the formation of the two parts of the circuit. Thus, for example, it could be of U-shape or horseshoe shape or it could be of elongated form, the two parts of the circuit being situated on either side of the center part in the longitudinal direction.

Finally, it is obvious that the device according to the invention could be obtained from a semi-conductor monocrystal of n-type, the layers 3 and the zones 4 being of p-type and of n-type respectively. It will be obvious that the polarity of the voltages must in this case be reversed.

What I claim is:

1. In an electronic semi-conductor device comprising at least one bistable electric circuit, a monocrystalline semi-conductor support, electrical resistances and monocrystalline semi-conducting portions of opposite type of conduction to that of the support on the support for each circuit, and two semi-conducting components of the same type as the support on the support for each circuit which are so disposed that they each form a fieldistor with a corresponding one of said portions, the two fieldistors being in series electrical connection with said resistances, two direct voltage sources each connected to one of the two identical parts of the circuit formed by said resistances, said fieldistors and the support, the voltages of these sources being so that the barrier between the support and said monocrystalline portions forms an electrical insulation, said component of the fieldistor of one of said parts being connected to the point of connection between the resistance and the fieldistor of the other of said parts, an alternating-voltage source connected to the said point of connection, and a capacitor through which the said alternating-voltage source is connected to the said point of connection, so that an appropriate voltage pulse sent from said alternating-voltage source produces extension of the barriers in the fieldistor in the conductive state and contraction of the barriers in the fieldistor in the blocked state, and consequently change-over of the circuit formed of said two parts from one of its stable states to the other.

2. In an electronic semi-conductor device comprising at least one bistable electric circuit, a monocrystalline semi-conductor support, electrical resistances and monocrystalline semi-conducting portions of opposite type of conduction to that of the support on said support for each circuit, and two semi-conducting components of the same type as the support which are so disposed that they each form a fieldistor with a corresponding one of said portions, said resistances each comprising a monocrystalline semi-conducting layer of opposite type of conduction to that of the support and each of the two fieldistors being in series electrical connection with a corresponding one of said resistances through a corresponding one of said layers, two direct voltage sources each connected to one of the two identical parts of the circuit formed by said resistances, said fieldistors and the support, the voltage of these sources being so that the barrier between the support and the said monocrystalline portions forms an electric insulation, said component of the fieldistor of one of said parts being connected to the point of connection between the resistance and the fieldistor of the other of said parts, an alternating-voltage source connected to the said point of connection, and a capacitor through which the said alternating-voltage source is connected to the said point of connection, so that an appropriate voltage pulse sent from said alternating-voltage source produces extension of the barriers in the fieldistor in the conductive state and contraction of the barriers in the fieldistor in the blocked state, and change-over of the circuit formed of said two parts from one of its stable states to the other.

3. Device as claimed in claim 2, in which said resistances connected in series with the fieldistors are said monocrystalline semi-conducting portions of opposite type of conduction to said support, which with said semi-conducting components form said fieldistors.

4. In a device as claimed in claim 2, in which said monocrystalline semi-conducting layer, of opposite type of conduction to said support, forming said resistances, comprises a semi-conducting zone of opposite type of conduction, so that the space charge zone resulting therefrom increases the values of said resistance.

5. In a device as claimed in claim 2, in which said monocrystalline semi-conducting layer, of opposite type of conduction to said support, forming said resistance, comprises, a semi-conducting zone of opposite type of conduction, said zone being connected to the said direct-voltage source, so that the space charge zone resulting therefrom increases the values of said resistance.

6. In a device as claimed in claim 2, in which said monocrystalline semi-conducting layer, of opposite type of conduction to the support, forming said resistance, comprises a semi-conducting zone of opposite type of conduction, said zone being connected through a low-pass filter to the point of connection of said resistance and fieldistor of the other part of the circuit, so that its barrier depends upon the potential to which the said point of connection is subjected.

7. In an electronic semi-conductor device comprising at least one bistable electric circuit, a monocrystalline semi-conductor support, electrical resistances and monocrystalline semi-conducting portions of opposite type of conduction to that of the support on said support, and components of the same type as the support which are so disposed that they each form with the said portions of fieldistor, the two fieldistors each being connected in series with a corresponding one of said resistances, two direct voltage sources each connected to one of the two identical parts of the circuit, formed by said resistances, said fieldistors and the support, so that the barrier between the support and said monocrystalline portions forms an electric insulation, said component of the fieldistor of one said part being connected to the point of connection between the resistance and the fieldistor of the other said part, an alternating-voltage source connected to the said point of connection, and a capacitor through which said alternating-voltage source is connected to said point of connection, so that an appropriate voltage pulse sent from said alternating-voltage source produces extension of the barriers in the fieldistor in the conductive state and contraction of the barriers in the fieldistor in the blocked state, and change-over of the circuit formed of the said two parts from one of its stable states to the other.

8. In an electronic semi-conductor device comprising a number of bistable circuits, a monocrystalline semi-conductor support, electrical resistances and monocrystalline semi-conducting portions of opposite type of conduction to that of the support on said support for each circuit, and two semi-conducting components of the same type as the support which are so disposed that they each form a fieldistor with a corresponding one of said portions, the two fieldistors thus formed each being connected in series with a corresponding one of said resistances, two direct voltage sources each connected to one of the two identical parts of the circuit formed by said resistances, said fieldistors and the support, the voltage of these sources being so that the barrier between the support and said monocrystalline portions forms an electric insulation, said component of the fieldistor of one part being connected to the point of connection between the resistance and the fieldistor of the other part, an alternating-voltage source connected to the said point of connection, and a capacitor through which the said alternating-voltage source is connected to the said point of connection, so that an appropriate voltage pulse sent from said alternating-voltage source produces extension of the barriers in the fieldistor in the blocked state, and consequently change-over of the circuit having said two parts from one of its stable states to the other, said bistable circuits being connected together in such manner as to form a counting device, in which the output of one circuit is connected to the input of the succeeding circuit through a decoupling device.

9. Device as claimed in claim 8, in which the said decoupling device includes a fieldistor connected between the support and resistance insulated from the latter, the said zone of the fieldistor being connected to the output of the preceding circuit, the input of the succeeding circuit being connected between the fieldistor and the resistance, and the other end of the latter being subjetced to a direct voltage of like sign and at least higher than that feeding the bistable circuits.

References Cited in the file of this patent

UNITED STATES PATENTS

| | | |
|---|---|---|
| 2,877,358 | Ross | Mar. 10, 1959 |
| 2,927,221 | Armstrong | Mar. 1, 1960 |
| 2,956,180 | James | Oct. 11, 1960 |
| 2,971,140 | Chappey et al. | Feb. 7, 1961 |